(12) United States Patent
Aoyama

(10) Patent No.: US 6,876,079 B2
(45) Date of Patent: Apr. 5, 2005

(54) SEMICONDUCTOR DEVICE AND METHOD OF MANUFACTURING THE SAME

(75) Inventor: Junichi Aoyama, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/082,576

(22) Filed: Feb. 25, 2002

(65) Prior Publication Data

US 2002/0163081 A1 Nov. 7, 2002

(30) Foreign Application Priority Data

Feb. 27, 2001 (JP) .................................. P2001-052197

(51) Int. Cl.[7] .......................... H01L 23/48; H01L 23/52; H01L 29/40
(52) U.S. Cl. ...................... 257/758; 257/762; 257/765; 257/774
(58) Field of Search ................................ 257/758–760, 257/762, 765, 773–774; 438/622–627, 674–675, 686

(56) References Cited

U.S. PATENT DOCUMENTS 5,783,485 A * 7/1998 Ong et al. ................. 438/637
6,063,703 A * 5/2000 Shinriki et al. ............. 438/653
6,215,189 B1 * 4/2001 Toyoda et al. .............. 257/773
2002/0068427 A1 * 6/2002 Guo et al. .................. 438/618

FOREIGN PATENT DOCUMENTS

JP          08213391 A  *  8/1996   ....... H01L/21/3205
JP          08339973 A  * 12/1996   ......... H01L/21/285

* cited by examiner

*Primary Examiner*—Shouxiang Hu
(74) *Attorney, Agent, or Firm*—Sonnenschein, Nath & Rosenthal LLP

(57) ABSTRACT

The present invention is to improve yield and reliability in a wiring step of a semiconductor device. When an Al wiring on an upper layer is connected through an connection pillar onto an Al wiring on a lower layer embedded in a groove formed on an interlayer insulation film, a growth suppression film having an opening whose width is wider than that of the Al wiring is formed on the interlayer insulation film and the Al wiring. In this condition, Al and the like are grown by a selective CVD method and the like. Accordingly, the connection pillar is formed on the Al wiring within the opening, in a self-matching manner with respect to the Al wiring.

17 Claims, 5 Drawing Sheets

SEMICONDUCTOR DEVICE AND METHOD OF MANUFACTURING THE SAME

CROSS REFERENCES TO RELATED APPLICATIONS

The present document is based on Japanese Priority Document JP 2001-052197, filed in the Japanese Patent Office on Feb. 27, 2001, the entire contents of which being incorporated herein by reference.

BACKGROUND OF THE INVENTION

1. Field of the Invention

The present invention relates to a semiconductor device and a method of manufacturing the same. More particularly, it is suitable for an application to a semiconductor device in which a wiring on an upper layer and a wiring on a lower layer are connected to each other through a connection pillar.

2. Description of Related Art

In a main technique presently being used to connect a wiring on an upper layer and a wiring on a lower layer to each other through a connection pillar in a semiconductor device such as a silicon semiconductor integrated circuit device and the like, an interlayer insulation film is formed for covering the wiring on the lower layer, and a via hole (connection hole) is formed on the interlayer insulation film, and metal is then embedded in the via hole by using a sputtering method, a CVD method, and a plating method and the like, and the connection pillar is accordingly formed. Although differing from only the mechanism that a via hole and a wiring groove are embedded at the same time, even a so-called dual damascene method, which has been recently remarked in a copper wiring, is the technique belonging to the above-mentioned technique. Also, a pillar method of forming a connection pillar before forming an interlayer insulation film was proposed in the past. However, this technique forms the connection pillar by using a lift-off method and an etching method. Thus, it is only the alternative technique in the age when the formation of a deep hole was difficult.

However, even if the main technique in the above-mentioned conventional methods of forming the connection pillar continues using a material in Si oxide film system as the interlayer insulation film, it becomes difficult to embed the metal in association with the reduction in a diameter of the via hole and the increase in an aspect ratio of the via hole. Also, if a base film is required in order to improve the adhesion and grow the film, it is extremely difficult to make the film thickness thinner in proportion to the diameter of the via hole. This leads to a sharp increase in a wiring resistance of the via hole portion even if a metal of a low resistivity is used. Moreover, if the interlayer insulation film is replaced by a film of a low dielectric constant, it is difficult to suppress the so-called "poisoned via" (a phenomenon that the defect of the metal embedded by the sputtering method, the CVD method and the like is caused by out-gas from a side wall of the interlayer insulation film) as compared with the case of the usage of the interlayer insulation film in the Si oxide film system. Also, this technique results in a problem that each time the kind of the film of the low dielectric constant is changed, another suppressing method must be reconsidered.

Also, if the conventional pillar method employs the lift-off method, a lift-off film is limited to resist, and the embedding method is limited to the plating method (thus, a metal such as Al cannot be used by the typical method). After all, since only the embedded target is different, the above-mentioned problems cannot be solved. Also, in the case of the usage of the etching method, after the formation of a metal film on the entire surface of substrate, it is etched to then form the connection pillar. However, this method requires two adjustments of mask (the first adjustment of the mask is carried out in a lithography process for forming an opening in the interlayer insulation film on the lower layer wiring, and the second adjustment of the mask is carried out in a lithography process for etching the metallic film formed on the entire surface and then forming the connection pillar) in order to connect the connection pillar and the lower layer wiring. Hence, the defect caused by deviation in the mask adjustments is induced, which brings about a drop in the yield in the wiring process.

Therefore, in order to collectively solve the above-mentioned problems of the conventional techniques, the present invention provides a semiconductor device and the method of manufacturing the same. According to the present invention, it becomes possible to avoid the difficulty in the conventional technique for embedding the metal and the problem caused by the embedding operation, to settle the problem of the poisoned via and the problem of the wiring error caused by the mask adjustments, and to improve the yield and the reliability in the wiring process.

SUMMARY OF THE INVENTION

The inventor earnestly considered the solution of the above-mentioned problems in the conventional technique, and consequently found that the following conditions were important in order to solve them, and accordingly devised the present invention as the result of the further consideration based on that viewpoint.

(1) In a wiring pattern on a lower layer, when a connection pillar is formed in a portion connected to a wiring pattern on an upper layer, the connection pillar is formed without any growth guide such as a via hole, a lift-off resist and the like.

(2) In the wiring pattern on the lower layer, when the connection pillar is formed in the portion connected to the wiring pattern on the upper layer, the connection pillar is formed to be self-aligned with respect to the wiring pattern on the lower layer and in the crystallographically aligned condition.

(3) As a method of forming the connection pillar without any growth guide, a metal film is grown only on the connection pillar formation portion on the lower layer wiring, in a shape of needle in a particular direction by using a CVD method and the like.

(4) As a method of forming the connection pillar on the lower layer wiring to be self-aligned, the portion in which the connection pillar is undesired to be grown on the lower layer wiring is covered by growth suppression film, and the connection pillar is formed by the growing method described in the item (3).

(5) Al, Cu, Au, Ag and the like, which are metals of face-centered cubic structure, are used as the material for the lower layer wiring.

(6) An annealing method and a wiring growing method for setting a vertical direction in a particular azimuth such as <111> and the like are used on the wiring pattern surface.

(7) Silicon oxide ($SiO_2$) film, silicon nitride (SiN) film, oxide aluminum ($Al_2O_3$) film and the like are used as the growth suppression film. In particular, if the connection pillar is made of Al, it is desirable to use the oxide aluminum ($Al_2O_3$) film.

(8) Al, Cu, Au, Ag and the like which are metals of face-centered cubic structure are used as the material for the connection pillar.

That is, in order to solve the above-mentioned problems, a first aspect of the present invention provides a semiconductor device in which a second conductive layer is connected through a connection pillar onto a first conductive layer embedded in a groove formed on an insulation film. In the semiconductor device, the connection pillar is formed on the first conductive layer to be self-aligned with respect to the first conductive layer without any usage of a growth guide.

A second aspect of the present invention provides another semiconductor device in which a second conductive layer is connected through a connection pillar onto a first conductive layer embedded in a groove formed on an insulation film. In the semiconductor device, a growth suppression film having an opening whose width is wider than a width of the first conductive layer is formed on the insulation film and the first conductive layer, and the connection pillar is formed on the first conductive layer within the opening of the growth suppression film to be self-aligned with respect to the first conductive layer.

A third aspect of the present invention provides a method of manufacturing a semiconductor device, in which a second conductive layer is connected through a connection pillar onto a first conductive layer embedded in a groove formed on an insulation film. The method comprises the steps of forming the first conductive layer embedded in the groove formed in the insulation film; and forming the connection pillar on the first conductive layer to be self-aligned with respect to the first conductive layer without any usage of a growth guide.

A fourth aspect of the present invention provides another method of manufacturing a semiconductor device, in which a second conductive layer is connected through a connection pillar onto a first conductive layer embedded in a groove formed on an insulation film. The method comprises the steps of forming the first conductive layer embedded in the groove formed in the insulation film; forming a growth suppression film having an opening whose width is wider than a width of the first conductive layer on the insulation film and the first conductive layer; and forming the connection pillar on the first conductive layer within the opening of the growth suppression film to be self-aligned with respect to the first conductive layer.

In the present invention, materials of the first conductive layer, the connection pillar and the second conductive layer can be selected as necessary. In specific, metals having a face-centered cubic structure, such as Al, Cu, Au, Ag and the like and their alloys, namely, an Al alloy, a Cu alloy, an Au alloy, an Ag alloy and the like may be selected. Typically, the first conductive layer and the connection pillar are made of the same metal or alloy. Preferably, they are crystallographically aligned with each other. In particular, the first conductive layer and the connection pillar are preferably made of the same metal or the same alloy thereof having the above-mentioned face-centered cubic structure, and they have the <111> preferred orientation. Typically, the first conductive layer is the lower layer wiring, and the second conductive layer is the upper layer wiring.

As the method of forming the connection pillar on the first conductive layer to be self-aligned without any usage of the growth guide, for example, it is possible to use a selective CVD method. The growth suppression film used to attain the formation is, for example, the silicon oxide film, the silicon nitride film, the aluminum oxide film or the like. The proper material is selected from those films and used, on the basis of the material used for the connection pillar and the like. In particular, if the aluminum or the alloy thereof is used as the material for the connection pillar, the aluminum oxide film is preferably used as the growth suppression film.

According to the present invention having the above-mentioned configuration, the connection pillar is formed on the first conductive layer to b e self-aligned with respect to this first conductive layer without any usage of the growth guide. That is, it is not necessary to embed the metal in the via hole and the like when forming the connection pillar and to carry out the mask adjustment in the lithography process and the like. Thus, it is possible to avoid the various troubles in association with the embedding operation, the mask adjustment and the like. In addition, the connection pillar can be formed on the first conductive layer in the crystallographically aligned condition. Hence, it is possible to increase the coupling strength of the connection pillar to the first conductive layer and thereby improve the mechanical strength of the connection pillar.

As mentioned above, according to the present invention, the connection pillar is formed on the first conductive layer, to be self-aligned with respect to the first conductive layer without any usage of the growth guide. Thus, it is possible to avoid the difficulty in the operation for embedding the metal and the problem in association with the embedding operation in the conventional technique. Hence, there occurs no problem of the poisoned via. Also, there occurs no problem of the wiring error resulting from the mask adjustment. Therefore, it is possible to improve the yield and the reliability in the wiring process.

DETAILED DESCRIPTION OF THE PREFERRED EMBODIMENTS

An embodiment of the present invention will be described below with reference to the attached drawings. By the way, the same symbols are given to the same or corresponding portions in all the drawings of the embodiment.

FIGS. 1 to 5 are the perspective views illustrating a method of manufacturing a semiconductor device according to the embodiment of the present invention, and FIGS. 6 to 10 are the sectional views taken on the respective lines VI—VI to X—X of FIGS. 1 to 5, respectively.

Figure 1:
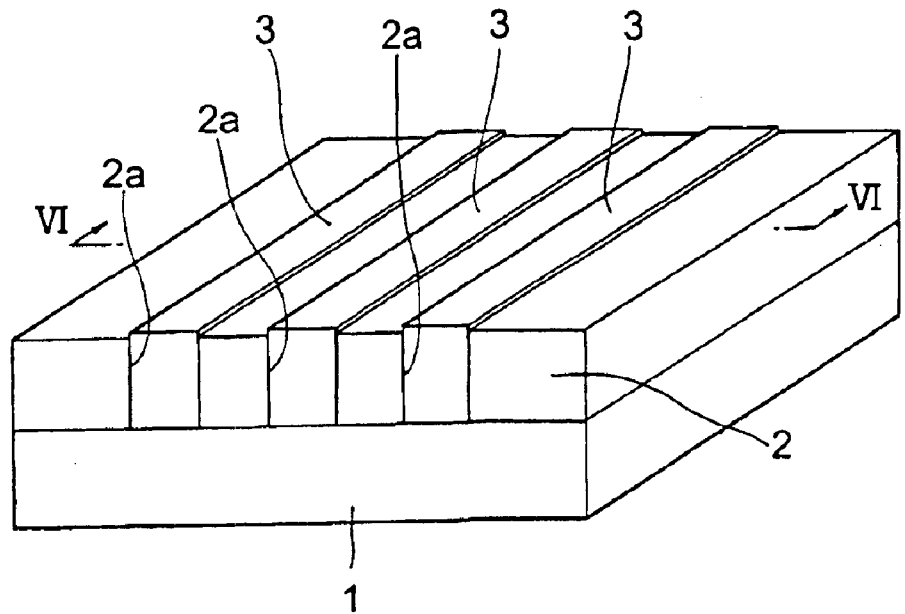
FIG. 1 is a perspective view describing a method of manufacturing a semiconductor device according to an embodiment of the present invention.
Figure 6:
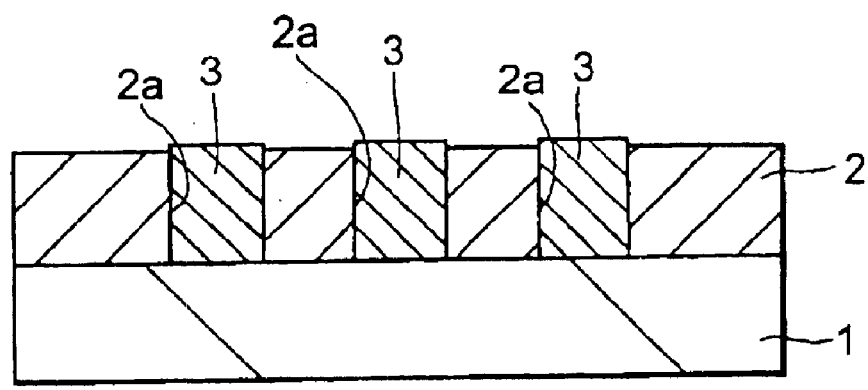
FIG. 6 is a sectional view taken on a line VI—VI of FIG. 1.

According to the method of manufacturing the semiconductor device according to this, as shown in FIGS. 1 and 6, an interlayer insulation film 2, for example, such as $SiO_2$ film, and Al wirings 3 being a first layer embedded in grooves 2a formed on the interlayer insulation film 2 are formed on a semiconductor substrate 1 such as an Si substrate on which separation between elements is carried out in advance and on which necessary elements (not shown) such as transistors and the like are formed. This Al wiring 3 can be formed by, for example, a so-called single damascene method. That is, at first, after the formation of the interlayer insulation film 2 on the entire surface of the substrate, the grooves 2a are formed on this interlayer insulation film 2 by etching. Next, after the formation of the Al films on the entire surface of the substrate, for example, a chemical mechanical polishing (CMP) method is used to polish and then remove the Al films on the portion except the grooves 2a. In this way, the Al wirings 3 which are embedded in the grooves 2a of the interlayer insulation film 2 are formed. Here, from the viewpoint of the easy excellent execution of pillar formation in future, it is important to improve <111>-orientation property in this Al wiring 3. Accordingly, in a case of the above-mentioned damascene process, it is effective to anneal, for example, at a high temperature of about 500° C. before removing the Al films except the portions of the grooves 2a by using the CMP method.

Figure 2:
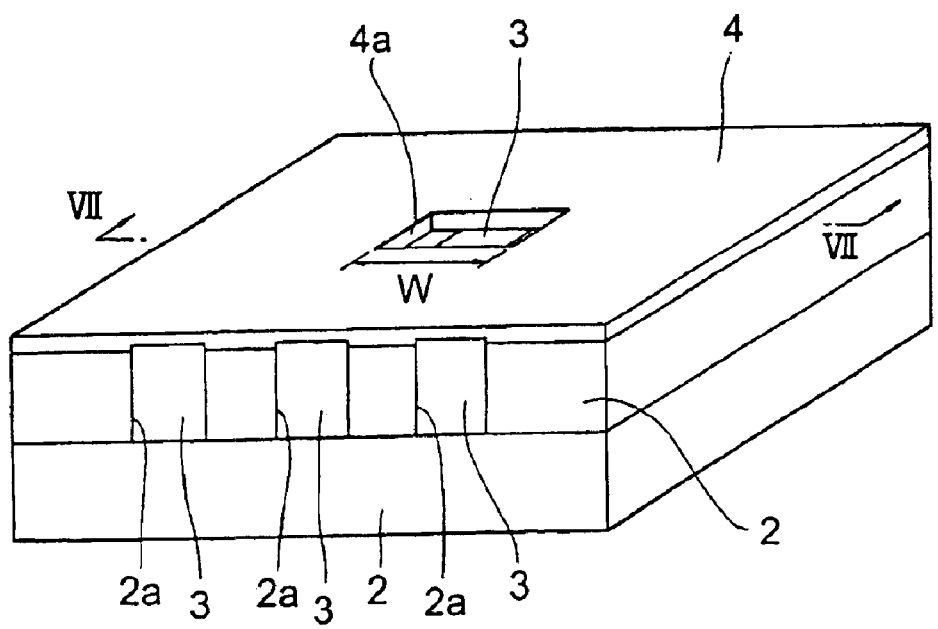
FIG. 2 is a perspective view describing the method of manufacturing the semiconductor device according to the embodiment of the present invention.
Figure 7:
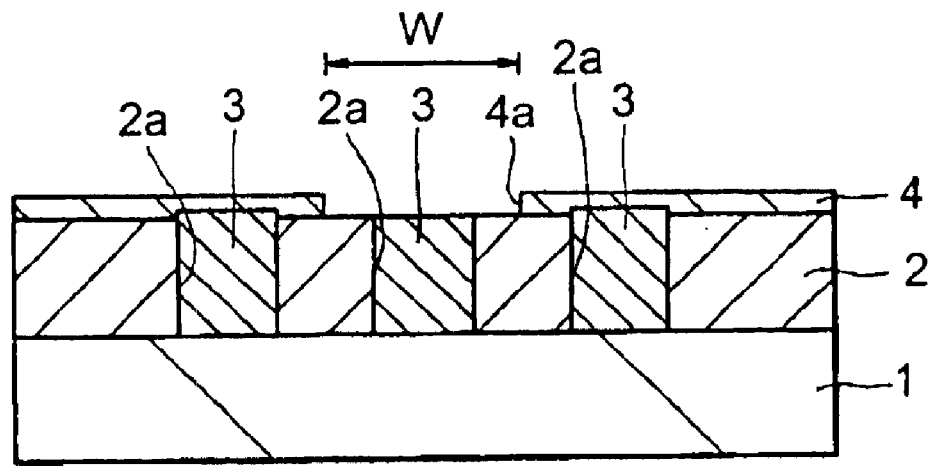
FIG. 7 is a sectional view taken on a line VII—VII of FIG. 2.

Next, as shown in FIGS. 2 and 7, after the formation of an Al growth suppression film 4 on the entire surface of the substrate, a predetermined portion of the Al growth suppression film 4 is etched and removed to accordingly form an opening 4a. In specific, this opening 4a is formed at a position and in a shape in which the Al wiring 3 of the portion forming the pillar is exposed therein. Also, a width W of the opening 4a is defined as a width in which a value less than the half of the wiring space is added to the width of the Al wiring 3. Such design enables an alignment deviation of less than one half the wiring space to be allowed without any short-circuit with the adjacent Al wiring 3. That is, the opening 4a can be formed without covering a part of a width direction of one Al wiring 3 and without exposing a part of the adjacent Al wiring 3. Next, in this condition, for example, a plasma process using $BCl_3$ gas is carried out to thereby remove $Al_2O_3$ (not shown) formed on the surface of the Al wiring 3 and then clean the surface. Here, for example, $SiO_2$ film, SiN film, $Al_2O_3$ film and the like can be used as the Al growth suppression film 4. Preferably, the $Al_2O_3$ film can be used among them. They can be formed by using, for example, the plasma CVD method and the like. The preparation for the formation of the pillar can be attained as mentioned above.

As will be described below, the Al pillar is formed on the Al wiring 3 exposed within the opening 4a. This Al pillar is formed by basically using the selective Al CVD method. However, this differs from the conventional technique in that it is formed under the condition in which there is no growth guide such as a via hole, a lift-off film and the like. In a case of metal having face-centered cubic structure such as Al, the growth is easily excited at a step of a {111} plane that is the closest packing plane. If the Al surface is exposed and its area is sufficiently smaller than the entire area, the pillar growth becomes possible in which the Al surface is used as a bottom.

Also, in order to haste the anisotropic growth (<111>-orientation) of Al, it is important to grow under a condition of a reaction rate controlling or in a condition close to the reaction rate controlling. However, to do so, it is effective to drop a temperature and reduce a surface reaction velocity, or drop a total pressure and increase a diffusion velocity. However, since the area of the pillar is sufficiently smaller than the entire area, it is important to control a partial pressure so that a raw material is not excessively supplied. Also, at this time, a pillar density brings about a microloading effect. However, a ratio of an area of a side to an area on a top plane of the pillar becomes greater in association with the growth. Thus, the height of the pillar is suppressed due to the effect, and it becomes uniform, which rather causes variation in the direction of the pillar diameter. However, this can be also controlled by an adjustment between a raw material gas concentration and a film formation time. Hence, it can be reduced to a level that does not present a problem on actual usage.

The following provides an example of a specific condition to form the Al pillar by using the selective Al CVD method.

Raw Material Gas: DMAH (Dimethyl Aluminum Hydride/$H_2$

Total Pressure: 133 Pa (1 Torr)

Partial Pressure: 13.3 Pa (0.1 Torr) Or Less

Growth Temperature: 200° C.

Figure 3:
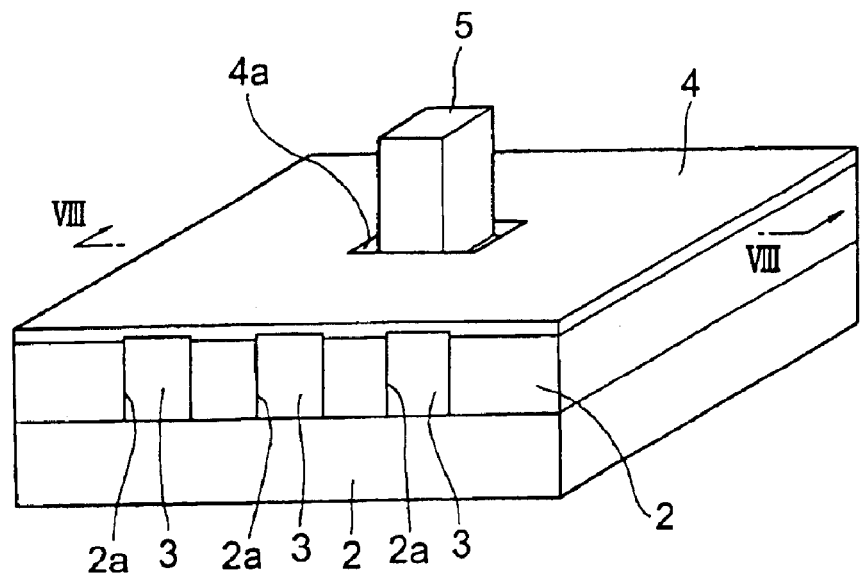
FIG. 3 is a perspective view describing the method of manufacturing the semiconductor device according to the embodiment of the present invention.
Figure 8:
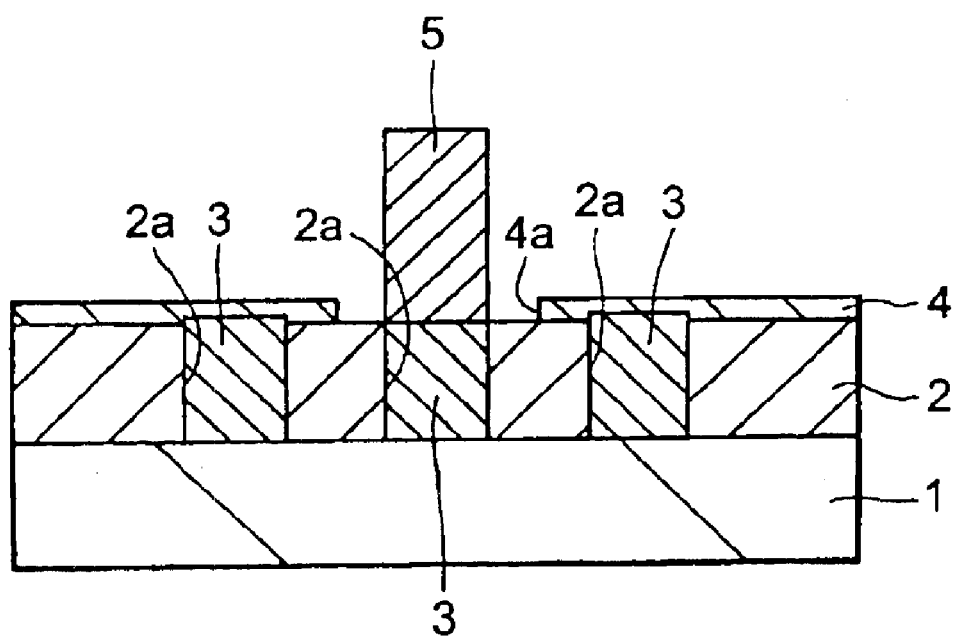
FIG. 8 is a sectional view taken on a line VIII—VIII of FIG. 3.

In this way, as shown in FIGS. 3 and 8, an Al pillar 5 in a shape of a square pillar is formed only on the Al wiring 3 within the opening 4a of the Al growth suppression film 4, without any growth guide, to be self-aligned with respect to the Al wiring 3. As an example of a dimension of this Al pillar 5, a width in a width direction of the Al wiring 3 is 0.1 $\mu$m, and a height thereof is 0.2 to 0.3 $\mu$m.

Figure 4:
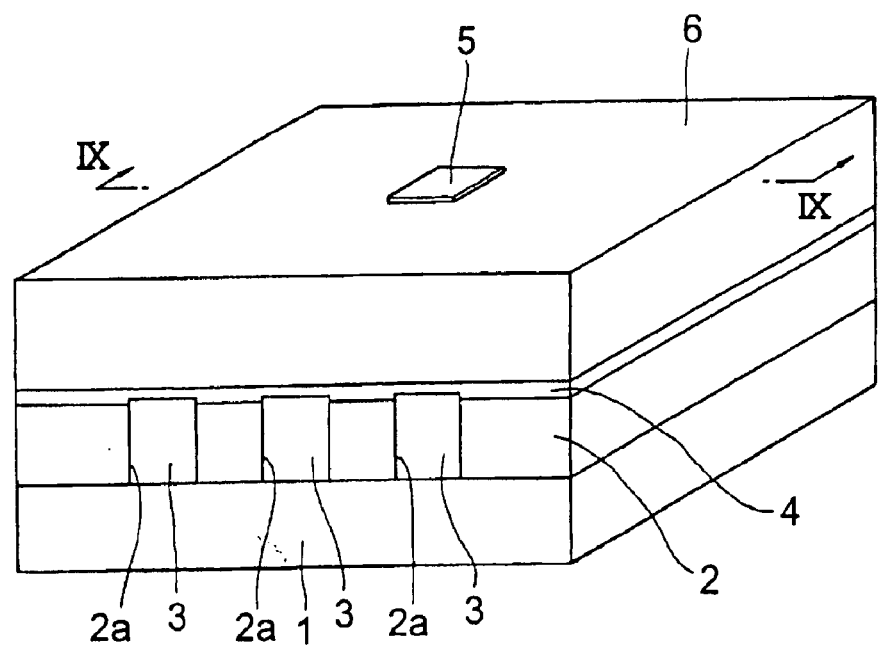
FIG. 4 is a perspective view describing the method of manufacturing the semiconductor device according to the embodiment of the present invention.
Figure 9:
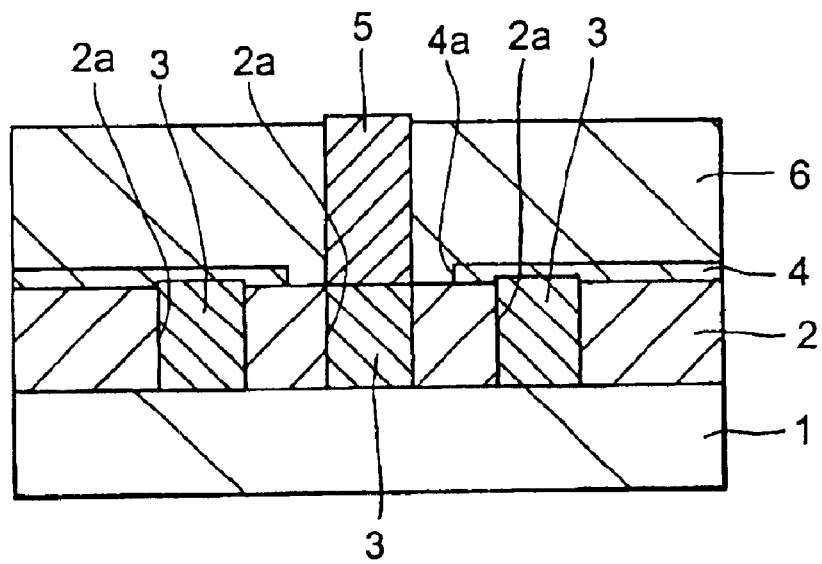
FIG. 9 is a sectional view taken on a line IX—IX of FIG. 4.

Next, as shown in FIGS. 4 and 9, after formation of an interlayer insulation film 6 on the entire surface of the substrate, the interlayer insulation film 6 is polished by, for example, the CMP method, and its surface is smoothed to then expose the top surface of the Al pillar 5.

Figure 5:
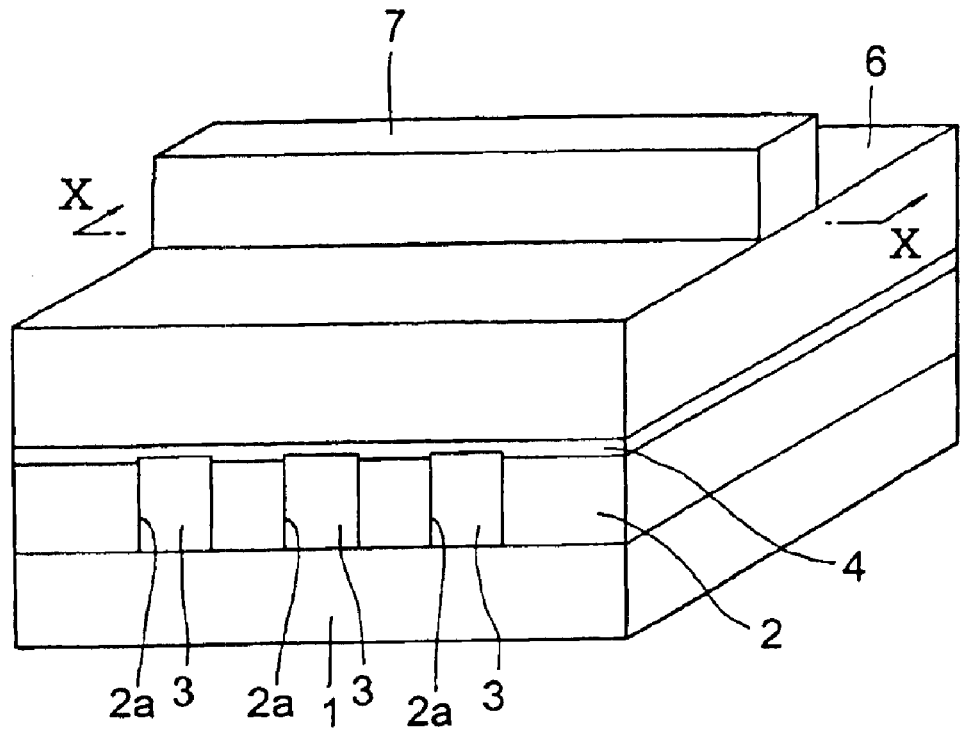
FIG. 5 is a perspective view describing the method of manufacturing the semiconductor device according to the embodiment of the present invention.
Figure 10:
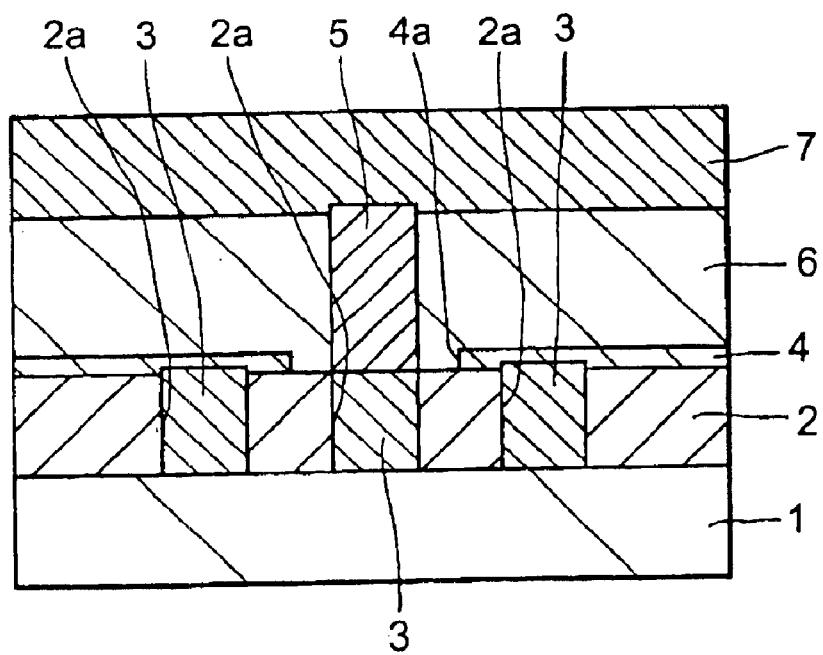
FIG. 10 is a sectional view taken on a line X—X of FIG. 5.

Next, as shown in FIGS. 5 and 10, an Al wiring 7 on a second layer is formed which is connected to the Al pillar 5.

The above-mentioned wiring forming process is repeated for a necessary number of times to thereby form a desirable multiple-layer wiring.

As mentioned above, according to the present embodiment, the portion in which the Al pillar in the Al wiring 3 on the first layer is formed is exposed in the opening 4a of the Al growth suppression film 4. In this condition, the Al growth is carried out by the selective Al CVD method. Thus, without any usage of the growth guide, the Al pillar 5 can be formed to be self-aligned with respect to the Al wiring 3 and in the condition that it is crystallographically aligned with the Al wiring 3 and it is superior in mechanical strength. An Al wiring 7 on a second layer can be connected through the Al pillar 5 to the Al wiring 3. For this reason, it is possible to largely improve the yield and the reliability in the wiring process. Hence, it is possible to reduce the manufacturing cost of the semiconductor device and improve the reliability. Also, the present embodiment does not require the operation for embedding in the via hole in forming the Al pillar 5. Hence, it is possible to sufficiently cope with the reduction in the design rule of the semiconductor device in association with higher integration.

As mentioned above, the embodiment of the present invention has been specifically described. However, the present invention is not limited to the above-mentioned embodiment. Various modifications may be made without departing from the technical spirit and scope of the present invention.

For example, the values, the structures, the processes and the like described in the above-mentioned embodiment are only the examples. Values, structures, processes and the like which are different from the above-mentioned cases may be used as necessary.

What is claimed is:

1. A semiconductor device in which a second conductive layer is connected through a connection pillar to a first conductive layer embedded in a groove formed in an insulation film, wherein:

said connection pillar is formed directly on a surface of said first conductive layer and exhibits a crystallographical alignment to the first conductive layer and a mechanical strength effected by being grown from the surface of the first conductive layer without use of any growth guide at a direction of a width of the first conductive layer such that the connection pillar has a width that is self-aligned to the width of the first conductive layer without use of any growth guide, and said second conductive layer is formed on a surface of the connection pillar opposite the first conductive layer.

2. A semiconductor device according to claim 1, wherein said first conductive layer is made of one of Al, Cu, Au and Ag.

3. A semiconductor device according to claim 1, wherein said first conductive layer is made of one of an Al alloy, a Cu alloy, an Au alloy and an Ag alloy.

4. A semiconductor device according to claim 1, wherein said connection pillar is made of one of Al, Cu, Au and Ag.

5. A semiconductor device according to claim 1, wherein said connection pillar is made of one of an Al alloy, a Cu alloy, an Au alloy and an Ag alloy.

6. A semiconductor device according to claim 1, wherein said first conductive layer and said connection pillar are made of the same metal or alloy.

7. A semiconductor device according to claim 1, wherein:

said first conductive layer and said connection pillar are made of the same metal or the alloy thereof having a face-centered cubic structure, and said first conductive layer and said connection pillar have a <111> preferred orientation.

8. A semiconductor device according to claim 1, wherein said first conductive layer is a lower layer wiring and said second conductive layer is an upper layer wiring.

9. A semiconductor device in which a second conductive layer is connected through a connection pillar to a first conductive layer embedded in a groove formed in an insulation film, wherein:

a growth suppression film formed on said insulation film and said first conductive layer, the growth suppression film having an opening formed through an entire thickness thereof, the opening positioned across a width of the first conductive layer and having a width that is wider than the width of the first conductive layer, and said connection pillar is formed directly on a surface of said first conductive layer within said opening of said growth suppression film and exhibits a crystallographical alignment to the first conductive layer and a mechanical strength effected by being grown from the surface of the first conductive layer without use of any growth guide at a direction of the width of the first conductive layer such that the connection pillar has a width that is sew-aligned to the width of the first conductive layer without use of any growth guide, and said second conductive layer is formed on a surface of the connection pillar opposite the first conductive layer.

10. A semiconductor device according to claim 9, wherein said first conductive layer is made of one of Al, Cu, Au and Ag.

11. A semiconductor device according to claim 9, wherein said first conductive layer is made of one of an Al alloy, a Cu alloy, an Au alloy and an Ag alloy.

12. A semiconductor device according to claim 9, wherein said connection pillar is made of one of Al, Cu, Au and Ag.

13. A semiconductor device according to claim 9, wherein said connection pillar is made of one of an Al alloy, a Cu alloy, an Au alloy and an Ag alloy.

14. A semiconductor device according to claim 9, wherein said first conductive layer and said connection pillar are made of the same metal or alloy.

15. A semiconductor device according to claim 9, wherein:

said first conductive layer and said connection pillar are made of the same metal or the alloy thereof having a face-centered cubic structure, and said first conductive layer and said connection pillar have a <111> preferred orientation.

16. A semiconductor device according to claim 9, wherein said growth suppression film is composed of one of a silicon oxide film, a silicon nitride film and an aluminum oxide film.

17. A semiconductor device according to claim 9, wherein said first conductive layer is a lower layer wiring and said second conductive layer is an upper layer wiring.

* * * * *